(12) United States Patent
Radjassamy (10) Patent No.: US 6,310,499 B1
(45) Date of Patent: Oct. 30, 2001

(54) METHODS AND APPARATUS FOR ADJUSTING THE DEADTIME BETWEEN NON-OVERLAPPING CLOCK SIGNALS (75) Inventor: Rajakrishnan Radjassamy, Plano, TX (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/617,373

(22) Filed: Jul. 17, 2000

(51) Int. Cl.⁷ .................................... H03K 3/017
(52) U.S. Cl. ............................ 327/175; 327/299
(58) Field of Search .................... 327/153, 155, 327/161, 166, 170, 172–176, 225, 259, 263, 239, 276, 291–294, 298, 299

(56) References Cited

U.S. PATENT DOCUMENTS

| | | | |
|---|---|---|---|
| 5,083,049 | * 1/1992 | Kagey | 327/298 |
| 5,124,572 | 6/1992 | Mason et al. | 307/269 |
| 5,306,962 | 4/1994 | Lamb | 307/269 |
| 5,675,273 | * 10/1997 | Masleid | 327/156 |
| 5,726,596 | 3/1998 | Perez | 327/292 |
| 5,760,610 | 6/1998 | Naffziger | 326/93 |
| 6,111,447 | * 8/2000 | Ternullo, Jr. | 327/292 |
| 6,181,185 | * 1/2001 | Shepston | 327/295 |

* cited by examiner

Primary Examiner—My-Trang Nuton (57) ABSTRACT

A clock gater circuit which may be easily tuned for the purpose of adjusting the deadtime between non-overlapping clock signals. The clock gater circuit has first and second clock inputs, a clock output, a falling clock edge generation circuit, and a rising clock edge generation circuit. The falling clock edge generation circuit is coupled between the first clock input and the clock output, and the rising clock edge generation circuit is coupled between the second clock input and the clock output. Each clock edge generation circuit has a feed-forward path and a feedback path. The feed-forward path of one of the clock edge generation circuits includes an inverter chain having an even number of inverters. If the inverter chain appears in the rising clock edge generation circuit, the inverter chain provides for easy adjustment of the rising edge of a clock produced by the gater circuit. However, an inverter chain which provides for easy adjustment of the timing of a clock edge may be provided in either or both of the clock edge generation circuits. When a clock gater circuit as described above is incorporated. into a system of clock gaters which produces a pair of non-overlapping clocks, the gater circuit can be used to easily adjust one or more deadtimes between the non-overlapping clocks.

17 Claims, 8 Drawing Sheets

METHODS AND APPARATUS FOR ADJUSTING THE DEADTIME BETWEEN NON-OVERLAPPING CLOCK SIGNALS

FIELD OF THE INVENTION

The invention pertains to the generation of clock signals, and more particularly, to the design of clock gater circuits which may be easily tuned for the purpose of adjusting the deadtime between non-overlapping clock signals.

BACKGROUND OF THE INVENTION

Many if not most of the integrated circuits which are being produced today comprise some number of clocked logic gates. A clocked logic gate is one which performs its function subsequent to the assertion (or deasertion) of a clock signal.

Figure 1:
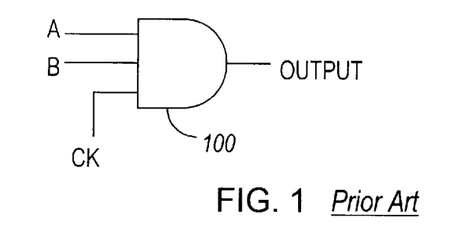
FIG. 1 illustrates a clocked logic gate which is activated by a clocked enable signal.

For example, some logic gates (e.g., some static logic gates) receive a clocked enable signal and cannot perform their intended functions until the enable signal is asserted. Such a clock enabled logic gate 100 is illustrated in FIG. 1.

Figure 2:
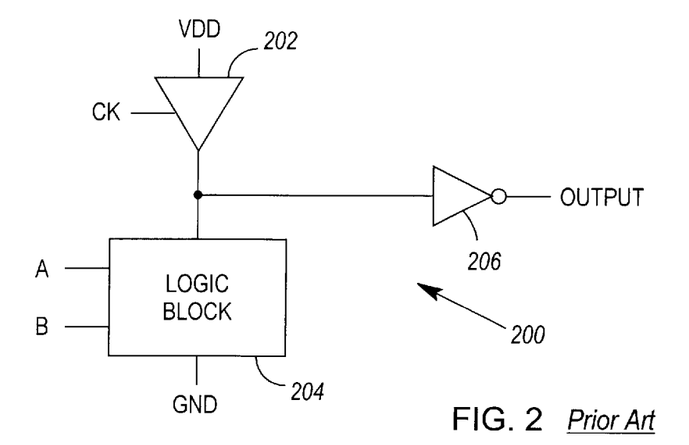
FIG. 2 illustrates a clocked logic gate which is alternately precharged and enabled by a clock signal.

Other logic gates (e.g., some dynamic logic gates) are alternately precharged and enabled by a clock signal, and can only perform their intended functions during the enable phase of the clock signal. A precharged logic gate 200 is illustrated in FIG. 2 and comprises a precharger 202, a logic block 204 for evaluating a desired logic function, and an inverting buffer 206.

Figure 3:
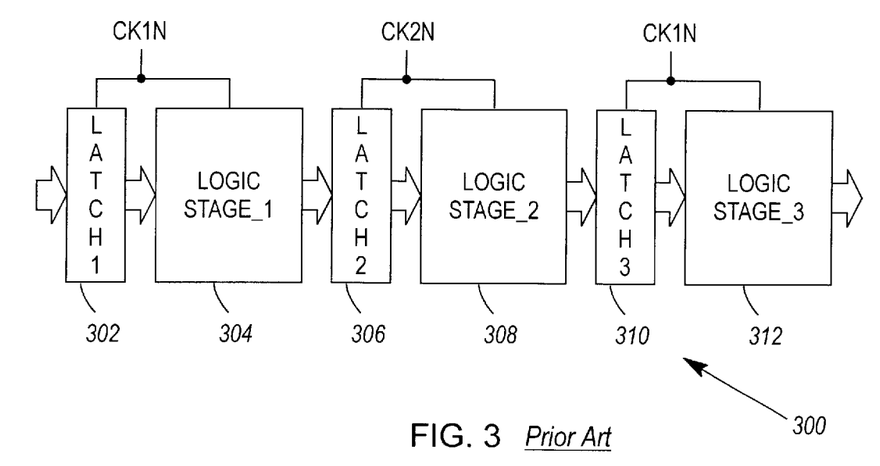
FIG. 3 illustrates a pipeline of clocked logic stages.
Figure 4:
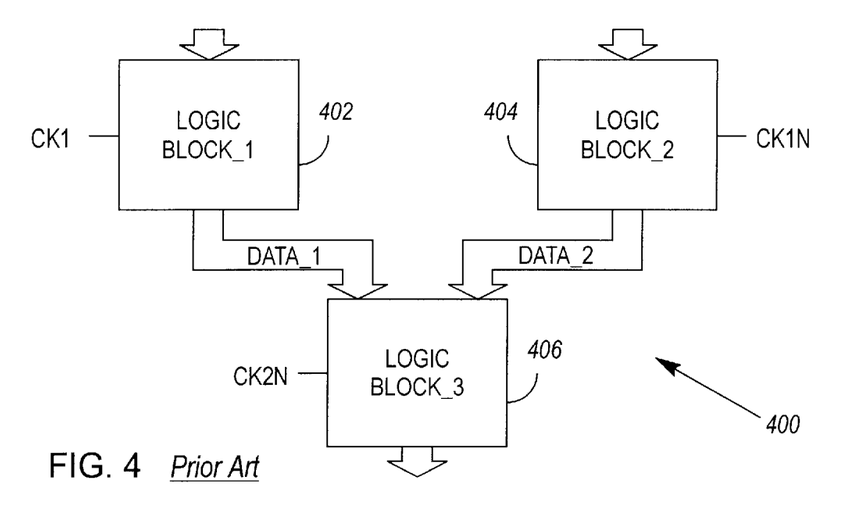
FIG. 4 illustrates two logic blocks feeding a logic junction.

Clocked logic gates 100, 200 are often interdependent on one another. For example, FIG. 3 illustrates a logic pipeline 300 in which data is alternately clocked through stages 304, 308, 312 of the pipeline 300. FIG. 4 illustrates two bodies of logic 402, 404 that generate data which is then combined in a later logic stage 406 (e.g., the two bodies of logic 402, 404 might respectively generate two addends which are input to an adder 406).

In each of the scenarios presented in FIGS. 3 & 4, the interdependence of the clocked logic gates requires an orderly and timely progression of data. Absent an orderly and timely progression of data through the logic pipeline 300 which is illustrated in FIG. 3, or the logic junction 400 which is illustrated in FIG. 4, data flowing through clocked logic gates 100, 200 is likely to be corrupted.

Typically, the orderly and timely progression of data through clocked logic gates 100, 200 is regulated by a pair of out-of-phase clocks. For example, the first of the clocks might cause data to propagate through odd logic stages 304, 312 of a pipeline 300 at multiples of time T, and the second of the clocks might cause data to propagate through even logic stages 308 of the pipeline 300 at multiples of time T+X, where X is not a multiple of T.

Figure 5:
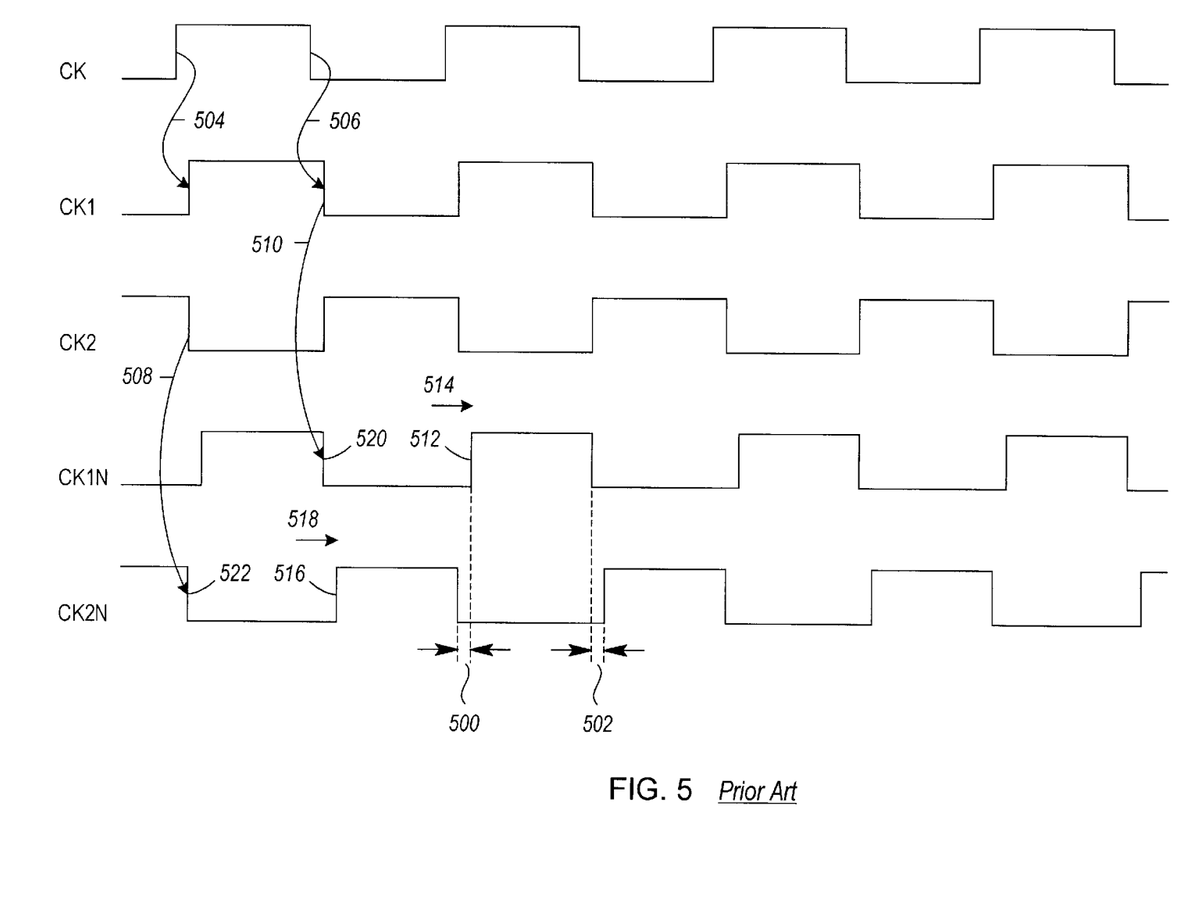
FIG. 5 illustrates a system clock signal, CK, a pair of overlapping clocks, CK1 and CK2, and a pair of non-overlapping clocks, CK1N and CK2N.

Theoretically, clocked logic gates 100, 200 should be able to be clocked with two clocks which are exactly 180° out-of-phase (e.g., clocks CK1 and CK2 in FIG. 5). However, real world conditions such as wire resistance, switching time, capacitance, clock skew, and clock edge degradation often prohibit the alternate clocking of sequential, clocked logic blocks 402, 406 (or logic stages 304, 308, 310) with 180° out-of-phase clocks. The problem with such a clocking scheme is that in many situations, a "race" is possible as soon as pulses of the two clocks start to overlap. A race is a condition in which data tends to propagate through more than one sequential, clocked logic block 402, 406 during a single clock period. Oftentimes, a race occurs as a result of data propagating through two or more sequential memory elements 302, 306, 310 during a single clock period.

Races may take a variety of forms, depending upon the configuration of the clocked logic blocks 100, 200 involved. For example, refer to the logic pipeline 300 illustrated in FIG. 3. If clock CK2N is not de-asserted prior to the assertion of clock signal CK1N, data being processed in LOGIC STAGE_1 can race through LATCH 1 and corrupt necessary data which has yet to be output from LOGIC STAGE_2. With respect to FIG. 4, a race can occur, for example, if new data propagates through LOGIC BLOCK_2 and overwrites the value of DATA_2 prior to the previous and required value of DATA_2 being consumed by LOGIC BLOCK_3.

From the above examples, one can see that when upstream data wins a race and catches up with downstream data, it is very likely that the downstream data will be corrupted. Race prevention is therefore critical to the effective operation of clocked logic gates 100, 200.

One way to prevent races is by alternately clocking sequential, clocked logic blocks 402, 406 with a pair of non-overlapping clocks. Such a pair of non-overlapping clocks is illustrated in FIG. 5 as clocks CK1N and CK2N. Note that between the pulses of each clock there is a "deadtime" during which neither of the clocks is asserted. A first deadtime 502 lies between the falling edge 520 of clock CK1N and the rising edge 516 of clock CK2N, and a second deadtime 500 lies between the falling edge 522 of clock CK2N, and the rising edge 512 of clock CK1N. Since deadtimes 500, 502 are times in which little or no useful work is done, it is important to adjust the deadtimes between non-overlapping clocks so that they are just long enough to prevent races from occurring, but no longer.

Figure 6:
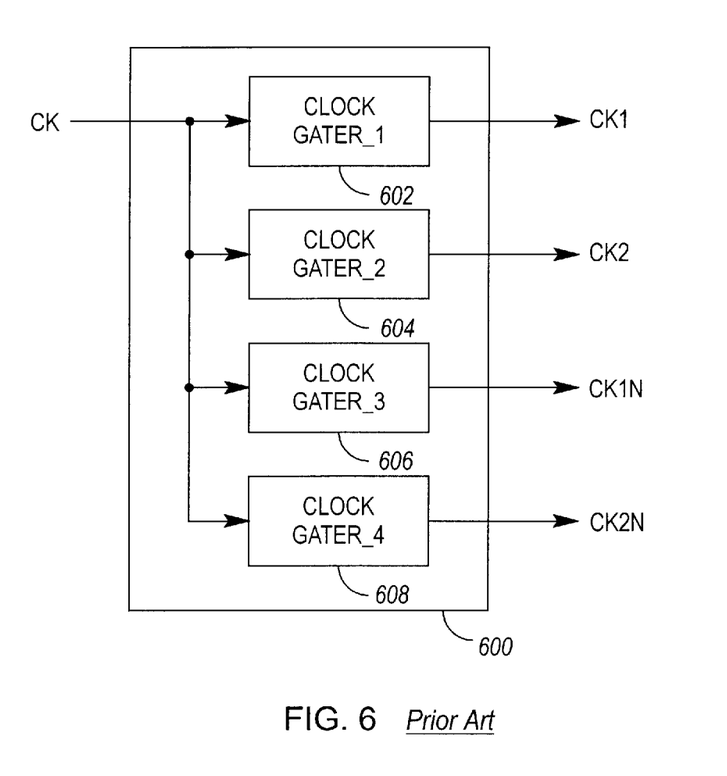
FIG. 6 illustrates a system of clock gaters for producing the CK1, CK2, CK1N and CK2N clocks illustrated in FIG. 5.

One way to produce out-of-phase clocks such as CK1, CK2, CK1N and CK2N (FIG. 5) is via a system 600 of clock gaters 602, 604, 606, 608 (FIG. 6). A clock gater 602, 604, 606, 608 is merely a circuit which receives a first clock signal and outputs a second clock signal, which second clock signal is out-of-phase with the first clock signal in one or more ways. For example, the pulses of the second clock signal may have rising and/or falling edges which are out-of-phase with the rising and falling edges of the first clock signal, or the pulses of the second clock signal may be of shorter or longer duration than those of the first clock signal.

A number of exemplary clock gater circuits are disclosed in U.S. Pat. No. 5,124,572 of Mason et al. entitled "VLSI Clocking System Using Both Overlapping and Non-overlapping Clocks", U.S. Pat. No. 5,306,962 of Lamb entitled "Qualified Non-Overlapping Clock Generator to Provide Control Lines with Non-Overlapping Clock Timing", U.S. Pat. No. 5,726,596 of Perez entitled "High-Performance, Low-Skew Clocking Scheme for Single-Phase, High-Frequency Global VLSI Processor Clocks", and U.S. Pat. No. 5,760,610 of Naffziger entitled "Qualified Universal Clock Buffer Circuit for Generating High Gain, Low Skew Local Clock Signals". These patents are hereby incorporated by reference for all that they disclose.

The patents of Mason et al. and Lamb disclose a clocking methodology for VLSI circuits which selectively uses the edges of two overlapping clocks and two non-overlapping clocks to eliminate race conditions. The overlapping clocks are used wherever possible to provide superior timing advantages, while the non-overlapping clocks are used to eliminate race conditions as data propagates down a pipeline of transparent registers. The patents of Perez and Naffziger disclose various improvements to the clocking methodologies disclosed in Mason et al. and Lamb.

Although all of the clock gater circuits disclosed in the above-referenced patents produce a pair of non-overlapping clocks, it is not particularly easy to adjust the deadtimes between any of these clocks. Doing so requires the resizing of clock gater transistors for the purpose of adding or subtracting from a deadtime. However, once appropriate transistors have been resized for the purpose of adjusting a deadtime, other transistors may need to be resized for the purpose of balancing loads, etc. Still other transistors may need to be resized if, for example, it is desired that the falling edges of clocks CK1 and CK1N fall in unison, or if it is desired that the falling edges of clocks CK2 and CK2N fall in unison.

A clock gater circuit which may be easily tuned for the purpose of adjusting the deadtime between non-overlapping clock signals is therefore needed.

SUMMARY OF THE INVENTION

Figure 7:
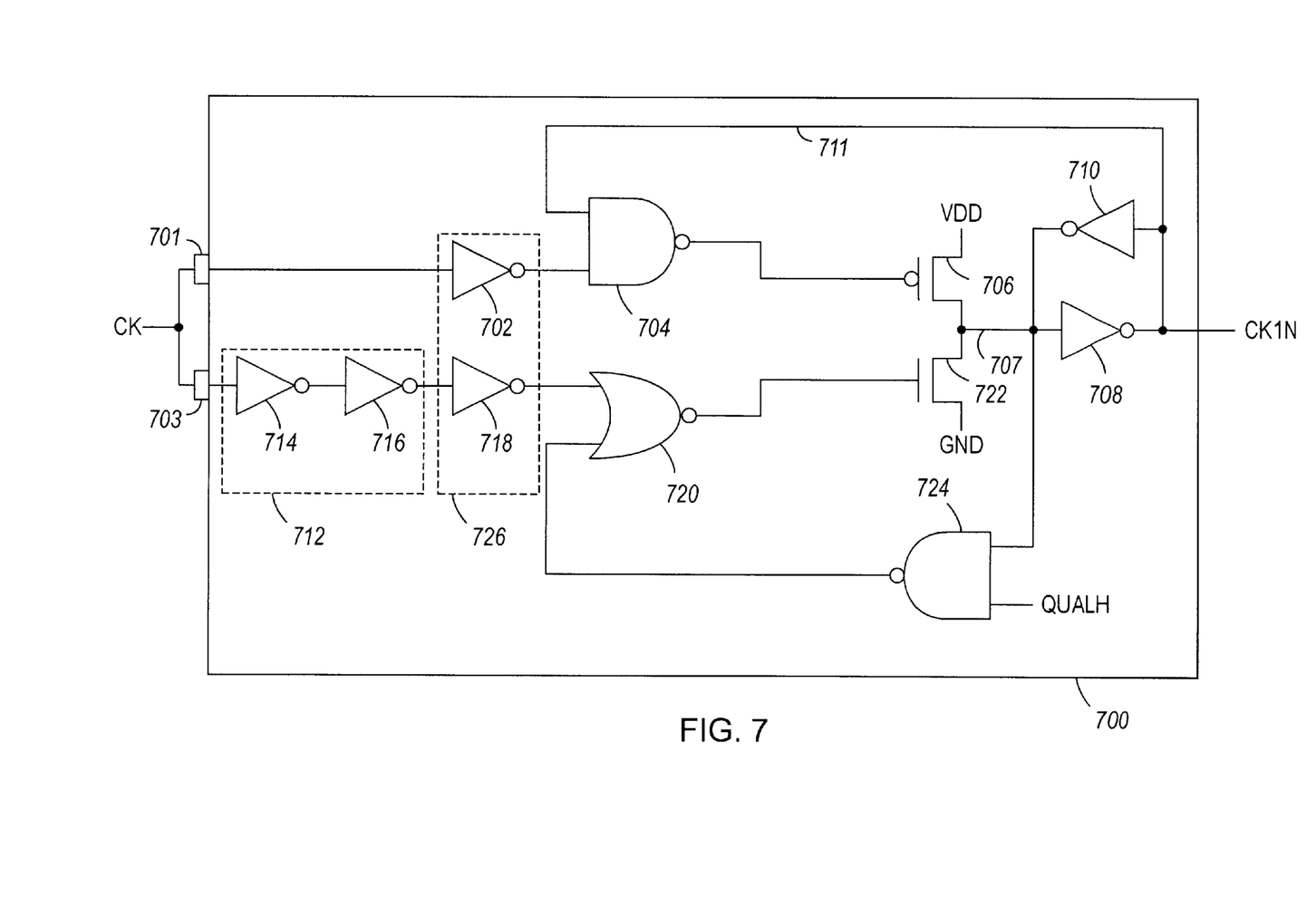
FIG. 7 illustrates a preferred embodiment of FIG. 6's CK1N clock gater circuit.

In accordance with the invention, an embodiment of a clock gater circuit 700 which may be easily tuned for the purpose of adjusting the deadtime between non-overlapping clock signals (e.g., CK1N and CK2N) is illustrated in FIG. 7. The clock gater circuit 700 comprises first and second clock inputs 701, 703, a clock output, a falling clock edge generation circuit 702, 704, 706, 708/710, and a rising clock edge generation circuit 712, 718, 720, 722, 708/710, 724. The falling clock edge generation circuit is coupled between the first clock input 701 and the clock output and comprises a feed-forward path 702, 704, 706, 708/710 and a feedback path 711. The rising clock edge generation circuit is coupled between the second clock input 703 and the clock output. Like the falling clock edge generation circuit, the rising clock edge generation circuit also comprises a feed-forward path 712, 718, 720, 722, 708/710 and a feedback path 724.

The feed-forward path of one of the clock edge generation circuits comprises an even number more inverters 712 than the feed-forward path of the other clock edge generation circuit. In FIG. 7, the rising clock edge generation circuit is shown to comprise the "even number more inverters" 712. As a result, the even number more inverters 712 illustrated in FIG. 7 provide for easy adjustment of the rising edge 512 of clock CK1N. However, the even number more inverters could just as easily have been placed in the falling clock edge generation circuit (see, e.g., the even number more inverters 1114, 1116 in the falling clock edge generation circuit of the FIG. 11 clock gater circuit 1100). Note that changes to inverters 714 and .716 lead to changes in the duty cycle of clock CK1N.

Also in accordance with the invention, an embodiment of circuitry 600 for producing non-overlapping clocks with a desired deadtime 500 is illustrated in FIG. 6. The circuitry 600 comprises first and second clock gater circuits 700, 900. The first clock gater circuit 900 comprises one or more inputs 901, 903 for receiving a clock signal, and an output for producing a first gated clock signal (i.e., clock CK2N in FIG. 9). The second clock gater circuit 700 also comprises first and second inputs 701, 703 for receiving said clock signal, and an output for producing a second gated clock signal. However, the second clock gater circuit 700 also comprises a falling clock edge generation circuit 702, 704, 706, 708/710 and a rising clock edge generation circuit 712, 718, 720, 722, 708/710, 724. The falling clock edge generation circuit is coupled between the first clock input 701 and the clock output and comprises a feed-forward path 702, 704, 706, 708/710 and a feedback path 711. The rising clock edge generation circuit is coupled between the second clock input 703 and the clock output and comprises a feed-forward path 712, 718, 720, 722, 708/710 and a feedback path 724. The feed-forward path of one of the clock edge generation circuits comprises an even number more inverters 714, 716 than the feed-forward path of the other clock edge generation circuit, whereby adjustments in one or more of the inverters 714, 716 change a deadtime 500 between the first and second gated clock signals (i.e., CK1N and CK2N). In FIG. 7, the even number more inverters 714, 716 are shown as a chain of inverters 712 which form part of the rising clock edge generation circuit. However, the chain of inverters 712 could just as easily form a part of the falling clock edge generation circuit (see, e.g., the inverter chain 1112 in the falling clock edge generation circuit of the FIG. 11 clock gater circuit 1100). In the latter case, adjustments in the inverter chain 712 would lease to adjustments in the timing of the falling edges 520 of clock CK1N, thereby resulting in an adjustment in deadtime 502. Alternately, a chain of inverters could be provided in each edge generation circuit.

The clock gater circuit 700 and system of clock gaters 600 which are summarized above provide for easy adjustments in the duty cycle of a gated clock signal (CK1N), and thus provide for easy adjustments to a deadtime 500 which falls between the falling edges 522 of one clock (e.g., CK2N) and the rising edges 512 of another clock (e.g., CK1N). Note that an adjustment in the duty cycle of a gated clock signal may be made by resizing one or more of the inverters 714, 716 which form the inverter chain 712. Once an adjustment is so made, no other component of a clock gater 700 need be adjusted. That is to say, one set of clock edges 512 may be adjusted without affecting the timing of the other set of edges 520, or without affecting other pre-established circuit timing, loading, and other parameters.

The invention is especially advantageous to one who wants to leverage blocks of an existing circuit design. If the existing circuit design comprises a clock gater 700 such as that illustrated in FIG. 7, an engineer who wants to leverage the clock gater 700 need understand very little about the timing of the clock gater 700 in general. All he or she need know is that a resizing of one or more inverters 714, 716 in an identified inverter chain 712 will produce changes in the timing of one of the clock edges 512 produced by the gater 700.

Note that another aspect of the invention is the ability to adjust the timing of a clock's remaining edges (e.g., the falling edges 520 of the clock signal produced by the FIG. 7 clock gater circuit 700). An additional pair of inverters 726 is provided for this purpose in FIG. 7. Note that inverter 702 is actually used to adjust the timing of the falling edges 520 of clock CK1N, and that inverter 718 is merely re-sized similarly to inverter 702 to prevent load mismatches in the falling and rising clock edge generation circuits. By using inverter 702 for load-matching (and not inverters 712), a degree of independence may be maintained between the inverter 702 which is used to adjust a clock's falling edges, and the inverters 712 which are used to adjust a clock's rising edges. Adjustments made to one clock edge therefore have little or no impact on adjustments made to the other clock edge, thus maintaining the "easy to adjust" nature of the clock gater 700.

These and other important advantages and objectives of the present invention will be further explained in, or will become apparent from, the accompanying description, drawings and claims.

BRIEF DESCRIPTION OF THE DRAWINGS

Illustrative and presently preferred embodiments of the invention are illustrated in the drawings in which.

DESCRIPTION OF THE PREFERRED EMBODIMENT

FIG. 7 illustrates a first preferred implementation of a clock gater circuit 700 which may be easily tuned for the purpose of adjusting the deadtime between non-overlapping clocks. The circuit 700 generally comprises a falling clock edge generation circuit 702, 704, 706, 708/710 and a rising clock edge generation circuit 714, 716, 718, 720, 722, 708/710, 724. As its name implies, the falling clock edge generation circuit determines the timing of falling clock edges which are produced at the gater's clock output. Likewise, the rising clock edge generation circuit determines the timing of rising clock edges which are produced at the gater's clock output.

The falling and rising clock edge generation circuits each comprise a feed-forward path and a feedback path. The feed-forward path of the falling clock edge generation circuit comprises four components: an inverter 702, a NAND gate 704, a pull-up transistor 706, and a latch 708/710. The feedback path of the falling clock edge generation circuit comprises a simple wire connection 711 between the output of the latch 708/710 and the NAND gate 704. The feed-forward path of the rising clock edge generation circuit comprises five components: an inverter chain 712, an additional inverter 718, a NOR gate 720, a pull-down transistor 722, and latch 708/710. The feedback path of the rising clock edge generation circuit comprises a connection between the input of latch 708/710 and NOR gate 720 through NAND gate 724.

Operation of the falling clock edge generation circuit is as follows. For illustration purposes, it will be assumed 1) that clock signal CK begins low, 2) that clock output CK1N has already transitioned to a low steady state (i.e., logic "0") in response to CK being low, and 3) that the feedback input to NAND gate 704 is at a low state. When clock CK transitions high, the output of inverter 702 transitions low after a delay which is determined by the size of the inverters' component transistors. With both inputs to NAND gate 704 being low, the output of NAND gate 704 remains high, thus failing to drive the gate of pull-up transistor 706. The falling clock edge generation circuit therefore has no affect on clock output CK1N when clock signal CK transitions from low to high.

Now consider the case when clock signal CK transitions from high to low. Prior to CK transitioning low, the rising clock edge generation circuit will have caused clock output CK1N to have transitioned high. As a result, the feedback input to NAND gate 704 will be high prior to CK transitioning low. When clock CK ultimately transitions low, the output of inverter 702 transitions high after a delay which is again determined by the size of the inverters' component transistors. With both inputs to NAND gate 704 being high, the output of NAND gate 704 transitions low. This, in turn, causes PFET (p-type field effect transistor) 706 to conduct, thus pulling node 707 to a high potential. Inverter 708 of latch 708/710 then causes output CK1N to transition low, thereby generating a falling clock edge at output CK1N.

When output CK1N transitions low, a feedback loop 711 provides a low signal to the feedback input of NAND gate 704, thus causing PFET 706 to stop conducting. The gater 700 is thereby set to respond to the next transition of clock signal CK, and a drive fight between the falling and rising clock edge generation circuits can be avoided. Output CK1N is held high by latch 708/710 until clock signal CK once again transitions low.

Operation of the rising clock edge generation circuit of clock gater 700 will now be discussed. Assume once again that clock signal CK begins low, and that clock output CK1N has already transitioned to a low steady state in response to CK being low. Node 707 will therefore be high. If qualifying signal QUALH is also high, then the feedback input of NOR gate 720 will be low. When clock CK transitions high, the output of inverter 718 will eventually transition low after a delay which is determined by the size of the component transistors in inverters 714, 716 and 718. With both inputs to NOR gate 720 being low, the output of NOR gate 720 will transition high and cause NFET (n-type field effect transistor) 722 to conduct. When NFET 722 conducts, node 707 is pulled low, and clock output CK1N rises. Thus, a rising clock edge is generated.

When node 707 is pulled low, NAND gate 724 outputs a high signal to NOR gate 720 (assuming that qualifying signal QUALH still remains high). Thereafter, NFET 722 stops conducting and output CK1N is held high by latch 708/710. Subsequently, clock CK will transition low, after which the output of inverter 702 will transition high after a delay stemming from the propagation of clock signal CK through inverters 714, 716 and 718. With both inputs to NOR gate 720 being high, the output of NOR gate 720 remains low, thereby causing NFET 722 to continue its period of non-conductance. The rising clock edge generation circuit therefore has no affect on clock output CK1N when CK transitions from high to low.

Note that the deassertion of qualifying signal QUALH (i.e., driving QUALH low) serves to disable the clock gater circuit 700. Subsequent to driving QUALH low, a low CK1N will remain low, and a high CK1N will transition low and then remain low. The uses and advantages of such qualifying signals are further described in U.S. Pat. No. 5,760,610 of Naffziger entitled "Qualified Universal Clock Buffer Circuit for Generating High Gain, Low Skew Local Clock Signals".

The clock gater circuit 700 illustrated in FIG. 7 may be easily tuned in several respects. One way to tune the circuit 700 is to resize the component transistors in the inverters 714, 716 forming the inverter chain 712 (perhaps by adjusting the ratios of the transistors in an inverter 714, 716). Doing so leads to the addition or subtraction of delay as a signal propagates through the inverter chain 712. For example, by sizing the channel widths of the transistors of inverter 714 smaller (or by sizing the channel lengths of the transistors larger if the fabrication process so permits), the drive currents through the channels of the transistors are reduced, and thus additional delay is imparted to the propagation of a signal through the inverter 714. Likewise, by sizing the channel widths of the transistors of inverter 714 larger, the drive currents through the channels of the transistors are increased, and a signal will propagate through the inverter 714 more quickly.

As previously discussed, the rising clock edge generation circuit has no influence on output CK1N when signal CK falls. As a result, any delay which is introduced by the inverter chain 712 of the rising clock edge generation circuit only affects output CK1N when signal CK rises. Any delay in the propagation of a rising edge of signal CK, which delay is introduced by the inverter chain 712, results in a more or less corresponding delay in the generation of a rising edge at output CK1N. Adjustments in the inverter chain 712 of the rising clock edge generation circuit therefore lead to adjustments in the timing of rising edges produced at clock output CK1N.

Another way to tune the clock gater circuit 700 illustrated in FIG. 7 is to resize the component transistors of inverter 702. Doing so leads to the addition or subtraction of delay as a signal propagates through inverter 702, and as a result, leads to an adjustment in the timing of falling edges produced at clock output CK1N.

Note that an adjustment to inverter 702, without more, creates a load mismatch between the falling and rising clock edge generation circuits of gater 700, which load mismatch can only be corrected by adjusting one or more inverters 714, 716 in the inverter chain 712. As a result, inverter 718 is provided in the rising clock edge generation circuit. When inverter 702 is adjusted, a similar adjustment can be made to inverter 718 to thereby prevent the afore-mentioned load mismatch. If one only desires to adjust the rising edges 512 of clock CK1N, the use of transistor 718 allows one to do so without affecting other timing and/or loading issues of gater 700.

Note that the FIG. 7 clock gater circuit 700, standing alone, provides a means for changing the duty cycle of clock signal CK1N by adjusting the timing of rising and falling edges 512, 520 produced at clock output CK1N. However, clock gater 700 is especially useful when it is used to fulfill the function of CLOCK GATER_3 in the FIG. 6 system of clock gaters. In such a role, the FIG. 7 clock gater 700 produces non-overlapping clock signal CK1N (FIG. 5). The afore-mentioned means for adjusting the FIG. 7 clock gater 700 therefore provide 1) a means for adjusting the deadtime 500 between falling edges 522 of clock CK2N and rising edges 512 of clock CK1N, and 2) a means for insuring that falling edges of clocks CK1N and CK1 fall in unison 510.

Clock gater 700 is preferably tuned to function within the system of clock gaters illustrated in FIG. 6 by first adjusting inverter 702 to insure that falling edges 520 of clock CK1N fall in unison with the falling edges of clock CK1 510, and then adjusting inverter 718 to ensure proper load matching. In light of the function performed by inverters 702 and 718 in this scenario, inverter 702 may sometimes be referred to herein as a falling edge adjustment (or synchronization) inverter, and inverter 718 may sometimes be referred to herein as a load matching inverter.

Adjustments in the falling edge adjustment and load matching inverters 726 will lead to some amount of delay being imparted to signals propagating through the rising clock edge generation circuit of FIG. 7, by virtue of inverter 718. An initial timing is therefore established for the rising edges 512 of clock CK1N, and an initial value for the deadtime 500 which exists between the falling edges of clock CK2N and the rising edges of clock CK1N is also established. However, this default deadtime 500 may be more or less than what is needed to prevent races in logic gates being clocked by non-overlapping clocks CK1N and CK2N. The inverters 714, 716 of the inverter chain 712 may therefore be adjusted to add or subtract to the initial value of the deadtime 500.

Figure 8:
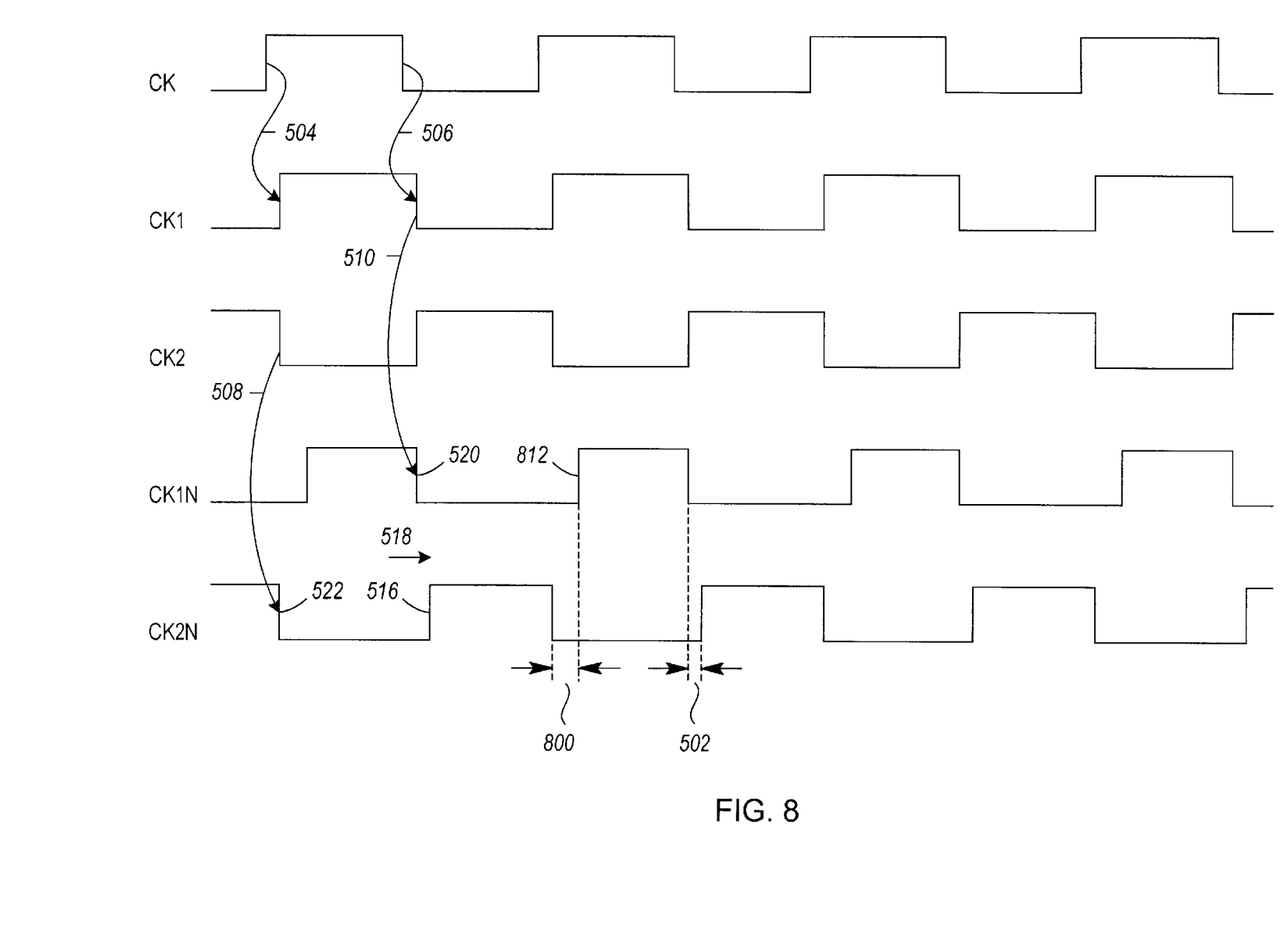
FIG. 8 illustrates how tuning the FIG. 7 clock gater circuit can provide an increased deadtime between the CK1N and CK2N clocks of FIG. 5.

If the channel widths of the transistors in an inverter 714, 716 of the inverter chain 712 are sized smaller, rising edge 512 will be pushed in the direction of arrow 514 (FIG. 5), thus increasing deadtime 500. For example compare the value of deadtime 500 (FIG. 5) with the value of deadtime 800 (FIG. 8). The greater deadtime 800 which is illustrated in FIG. 8 is due to a re-timing of edges 812. Note, however, that the timing of falling edges 520 remains unchanged in FIG. 8, thus preserving the relationship 510 between the falling edges of clocks CK1N and CK1.

Figure 11:
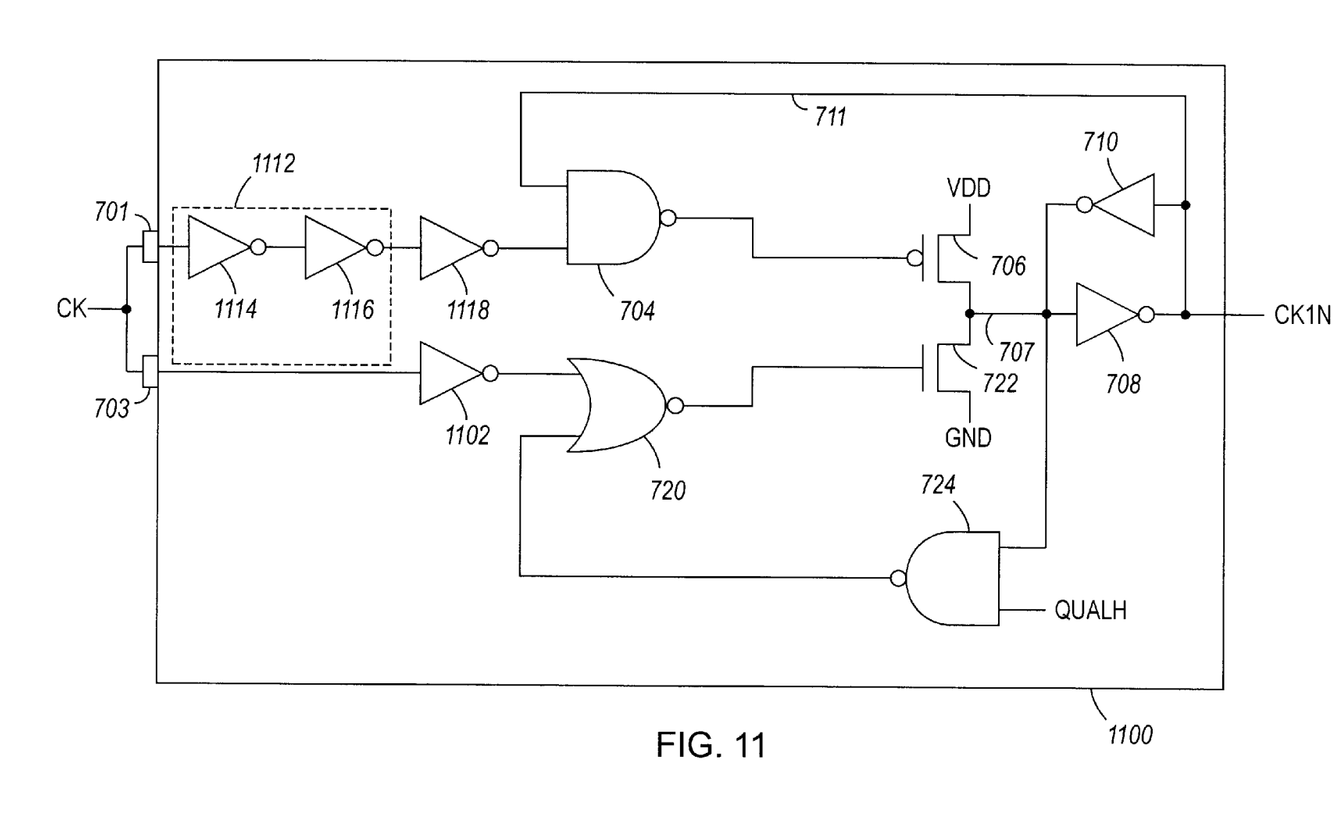
FIG. 11 illustrates an alternate embodiment of the FIG. 7 clock gater circuit.

FIG. 11 illustrates an alternate embodiment of the FIG. 7 clock gater circuit. The FIG. 11 clock gater circuit 1100 differs from the FIG. 7 clock gater circuit 700 in that the FIG. 11 circuit 1100 comprises an inverter chain 1112 in the feed-forward path of its falling clock edge generation circuit (and not in its rising clock edge generation circuit). The FIG. 11 circuit 1100 further comprises a rising edge adjustment inverter 1102 in the feed-forward path of its rising clock edge generation circuit, and a load-matching inverter 1118 in the feed-forward path of its falling clock edge generation circuit. The rising edge adjustment inverter 1102 can be adjusted to change the timing of the rising edges of the clock gater circuit 1100, whereas the load-matching inverter 1118 can be adjusted to match loads between the falling and rising clock edge generation circuits of the clock gater circuit 1100.

After having adjusted the deadtime between the falling edges 522 of clock CK2N and the rising edges 512 of clock CK1N, and having set the timing for falling edges 520 of clock CK1N, one might also want to adjust the deadtime 502 between the falling edges 520 of clock CK1N and the rising edges 516 of clock CK2N. Such an adjustment can be accomplished by constructing CLOCK GATER_4 of FIG. 6 as shown in FIG. 9.

Figure 9:
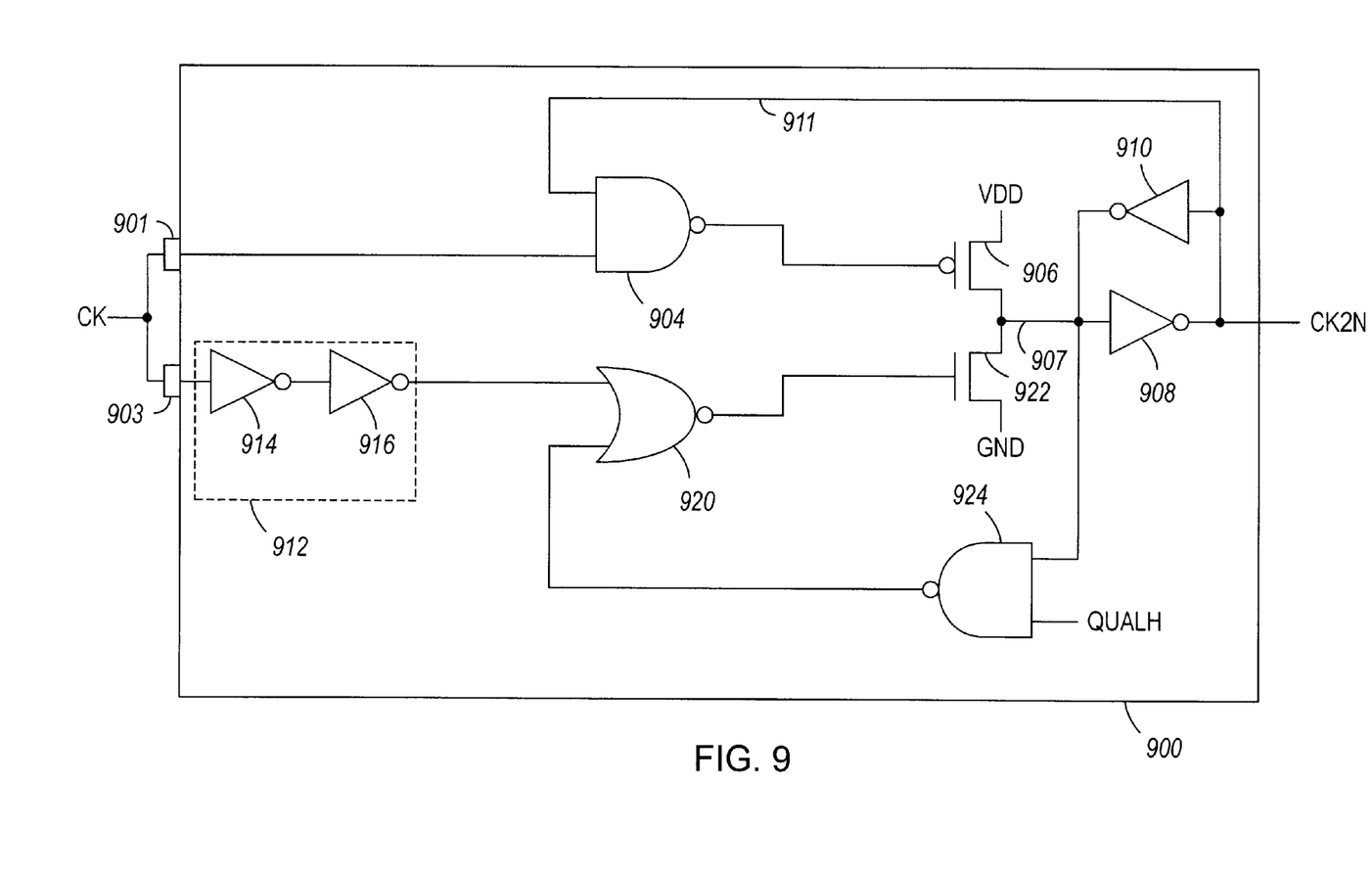
FIG. 9 illustrates a preferred embodiment of FIG. 6's CK2N clock gater circuit.

Construction of the FIG. 9 clock gater 900 is similar to that of the FIG. 7 clock gater, but for deletion of the falling edge adjustment and load-matching inverters 726. As in the FIG. 7 clock gater 700, the FIG. 9 clock gater comprises a falling clock edge generation circuit 904, 906, 908/910 and a rising clock edge generation circuit 914, 916, 920, 922, 908/910, 924.

The falling and rising clock edge generation circuits each comprise a feed-forward path and a feedback path. The feed-forward path of the falling clock edge generation circuit comprises three components: a NAND gate 904, a pull-up transistor 906, and a latch 908/910. The feedback path of the falling clock edge generation circuit comprises a simple wire connection 911 between the output of the latch 908/910 and the NAND gate 904. The feed-forward path of the rising clock edge generation circuit comprises four components: an inverter chain 912, a NOR gate 920, a pull-down transistor 922, and a latch 908/910. The feedback path of the rising clock edge generation circuit comprises a connection between the input of latch 908/910 and NOR gate 920 through NAND gate 924.

Operation of the falling clock edge generation circuit is as follows. For illustration purposes, it will be assumed 1) that clock signal CK begins high, 2) that clock output CK2N has already transitioned to a low steady state (i.e., logic "0") in response to CK being high, and 3) that the feedback input to NAND gate 904 is at a low state. When clock CK transitions low, the output of NAND gate 904 remains high, thus failing to drive the gate of pull-up transistor 906. The falling clock edge generation circuit therefore has no affect on clock output CK2N when CK transitions from high to low.

Now consider the case when clock CK transitions from low to high. Prior to CK transitioning high, the rising clock edge generation circuit will have caused clock output CK2N to have transitioned high. As a result, the feedback input to NAND gate 904 will be high prior to CK transitioning high. When clock CK ultimately transitions high, the output of NAND gate 904 transitions low. This, in turn, causes PFET (p-type field effect transistor) 906 to conduct, thus pulling node 907 to a high potential. Inverter 908 of latch 908/910 then causes output CK2N to transition low, thereby generating a falling clock edge at output CK2N. When output CK2N transitions low, the feedback input to NAND gate 904 also transitions low, thus causing the output of NAND gate 904 to transition high and causing PFET 906 to cease conducting. Thereafter, the value of clock output CK2N is held low by latch 908/910 until such time that CK makes another transition.

Operation of the rising clock edge generation circuit of clock gater 900 will now be discussed. Assume once again that clock signal CK begins high, and that clock output CK2N has already transitioned to a low steady state in response to CK being high. Node 907 will therefore be high. If qualifying signal QUALH is also high, then the feedback input of NOR gate 920 will be low. When clock CK transitions low, the output of inverter chain 912 will eventually transition low after a delay which is determined by the size of the component transistors in inverters 914 and 916. With both inputs to NOR gate 920 being low, the output of NOR gate 920 will transition high and cause NFET (n-type field effect transistor) 922 to conduct. When NFET 922 conducts, node 907 is pulled low, and clock output CK2N rises. Thus, a rising clock edge is generated.

When node 907 is pulled low, NAND gate 924 outputs a high signal to NOR gate 920 (assuming that qualifying signal QUALH still remains high). The output of NOR gate 920 is therefore driven low, and NFET 922 ceases to conduct. Subsequently, clock CK will transition high, after which the output of the inverter chain 912 will transition high after a delay stemming from the propagation of clock signal CK through inverters 914 and 916. Thereafter, the output of NOR gate 920 remains low, thus failing to drive the gate of the pull-down transistor 922. The rising clock edge generation circuit therefore has no affect on clock output CK2N when CK transitions from low to high.

The clock gater circuit 900 illustrated in FIG. 9 may be easily tuned by resizing the component transistors in the inverters 914, 916 of the inverter chain 912. Doing so leads to the addition or subtraction of delay as a signal propagates through the inverter chain 912.

As previously discussed, the rising clock edge generation circuit has no influence on output CK2N when signal CK rises. As a result, any delay which is introduced by the inverter chain 912 of the rising clock edge generation circuit only affects output CK2N when signal CK falls. Any delay in the propagation of a falling edge of signal CK, which delay is introduced by the inverter chain 912, results in a more or less corresponding delay in the generation of a rising edge at output CK2N. Adjustments in the inverter chain 912 of the rising clock edge generation circuit therefore lead to adjustments in the timing of rising edges produced at clock output CK2N.

Note that an inverter chain comprising an even number of inverters can also been incorporated into the falling clock edge generation circuit, for the purpose of adjusting the timing of falling clock edges which are produced at output CK2N. In fact, such an inverter chain may be desirable for the purpose of curing load-mismatch issues which might be created by the inverter chain 912.

Note that the FIG. 9 clock gater circuit 900 provides a means for changing the duty cycle of clock signal CK2N by adjusting the timing of rising edges produced at clock output CK2N. However, clock gater 900 is especially useful when it is used to fulfill the function of CLOCK GATER_4 in the FIG. 6 system 600 of clock gaters 602-608. In such a role, the FIG. 9 clock gater 900 produces non-overlapping clock signal CK2N (FIG. 8). The afore-mentioned means for adjusting the FIG. 9 clock gater 900 therefore provides a means for adjusting the deadtime 502 between falling edges 520 of clock CK1N and rising edges 522 of clock CK2N.

Figure 10:
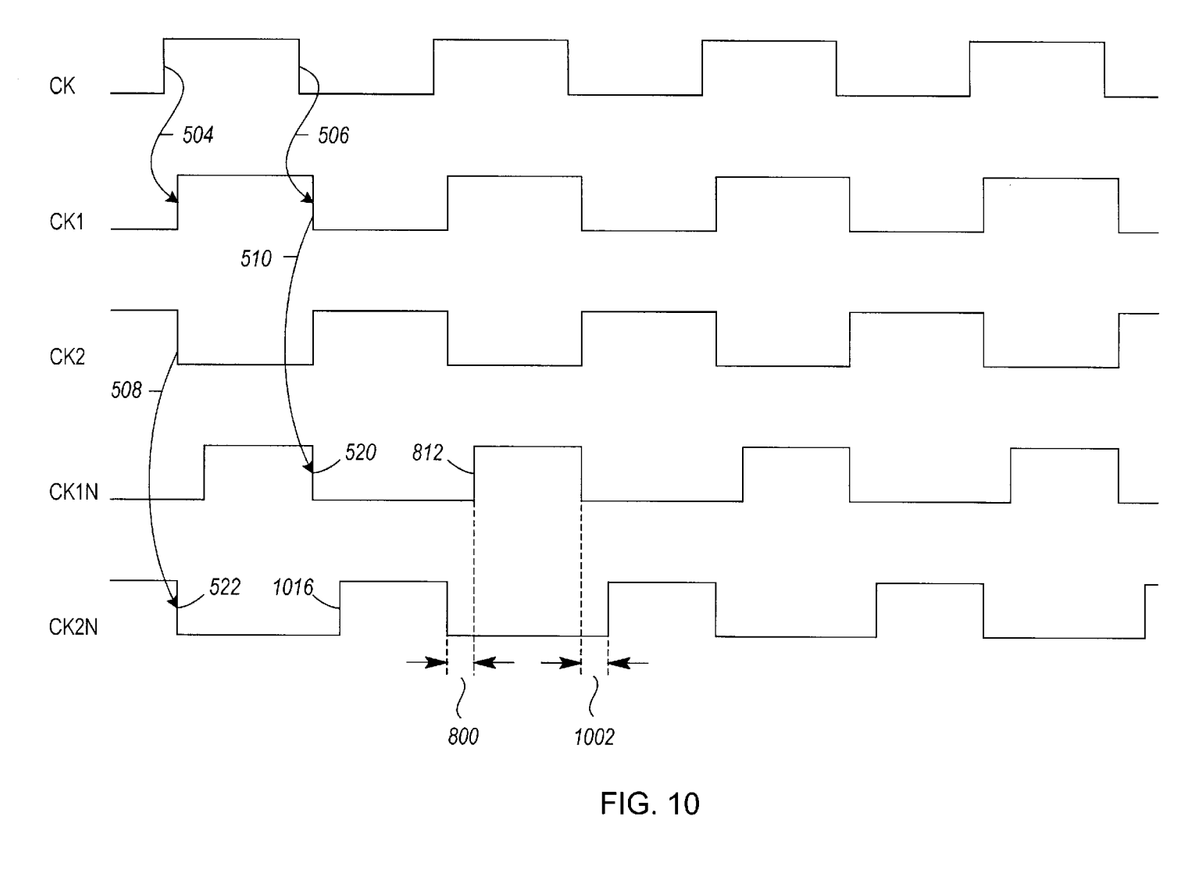
FIG. 10 illustrates how tuning the FIG. 9 clock gater circuit can also provide an increased deadtime between the CK1N and CK2N clocks of FIG. 5.

If the channel widths of the transistors in an inverter 914, 916 of the inverter chain 912 are sized larger, rising edge 516 will be pushed in the direction of arrow 518 (FIG. 8), thus increasing deadtime 502. For example compare the value of deadtime 502 (FIG. 8) with the value of deadtime 1002 (FIG. 10). The greater deadtime 1002 which is illustrated in FIG. 10 is due to a re-timing of edges 516. Note, however, that the timing of falling edges 522 remains unchanged in FIG. 10, thus preserving the relationship 508 between the falling edges of clocks CK2N and CK2.

Although methods and apparatus for adjusting the deadtime between non-overlapping clocks has been illustrated herein with respect to circuits 700, 900 comprising one particular configuration of falling and rising clock edge generation circuits, one skilled in the art will readily comprehend how the methods and apparatus disclosed herein may be adapted to other clock gater designs. For example, the methods and apparatus disclosed herein may be easily adapted to the clock gaters which are disclosed in the U.S. Patents referred to in the Background of the Invention.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A clock gater circuit, comprising:
   a) first and second clock inputs;
   b) a clock output;
   c) a falling clock edge generation circuit coupled between the first clock input and the clock output, said falling clock edge generation circuit comprising a feed-forward path and a feedback path; and
   d) a rising clock edge generation circuit coupled between the second clock input and the clock output, said rising clock edge generation circuit comprising a feed-forward path and a feedback path;
   wherein the feed-forward path of one of the clock edge generation circuits comprises an even number more inverters than the feed-forward path of the other clock edge generation circuit.

2. A clock gater circuit as in claim 1, wherein:
a) the feedback path of the falling clock edge generation circuit is coupled to a first input of a logic gate, which logic gate forms a part of the feed-forward path of the falling clock edge generation circuit; and
b) the even number more inverters are coupled between the first clock input and the logic gate.

3. A clock gater circuit as in claim 1, wherein:
a) the feedback path of the rising clock edge generation circuit is coupled to a first input of a logic gate, which logic gate forms a part of the feed-forward path of the rising clock edge generation circuit; and
b) the even number more inverters are coupled between the second clock input and the logic gate.

4. A method for changing the duty cycle of a clock signal, comprising:
a) providing a clock gater circuit comprising first and second clock inputs; a clock output; a falling clock edge generation circuit coupled between the first clock input and the clock output, said falling clock edge generation circuit comprising a feed-forward path and a feedback path; and a rising clock edge generation circuit coupled between the second clock input and the clock output, said rising clock edge generation circuit comprising a feed-forward path and a feedback path; wherein the feed-forward path of one of the clock edge generation circuits comprises an even number more inverters than the feed-forward path of the other clock edge generation circuit;
b) sizing one or more of the inverters to thereby affect a change in the duty cycle of a clock signal produced at said clock output.

5. A method as in claim 4, wherein the even number more inverters is two.

6. A method as in claim 5, wherein sizing one or more of the inverters consists of sizing only one of the two inverters.

7. Circuitry for producing non-overlapping clocks with a desired deadtime, comprising:
a) a first clock gater circuit, comprising:
 i) one or more inputs for receiving a clock signal; and
 ii) an output for producing a first gated clock signal; and
b) a second clock gater circuit, comprising:
 i) first and second inputs for receiving said clock signal;
 ii) an output for producing a second gated clock signal;
 iii) a falling clock edge generation circuit coupled between the first clock input and the clock output, said falling clock edge generation circuit comprising a feed-forward path and a feedback path; and
 iv) a rising clock edge generation circuit coupled between the second clock input and the clock output, said rising clock edge generation circuit comprising a feed-forward path and a feedback path;
 wherein the feed-forward path of one of the second clock gater circuit's clock edge generation circuits comprises an even number more inverters than the feed-forward path of the second clock gater circuit's other clock edge generation circuit, whereby adjustments in one or more of the inverters change a deadtime between the first and second gated clock signals.

8. Circuitry as in claim 7, wherein the even number more inverters lies in the feed-forward path of the rising clock edge generation circuit of the second clock gater circuit.

9. Circuitry as in claim 8, wherein the feed-forward path of the falling clock edge generation circuit of the second clock gater circuit comprises a falling edge adjustment inverter, which falling edge adjustment inverter can be adjusted to change the timing of the falling edges of the second gated clock signal.

10. Circuitry as in claim 9, wherein the feed-forward path of the rising clock edge generation circuit of the second clock gater circuit comprises a load-matching inverter, which load-matching inverter can be adjusted to match loads between the falling and rising clock edge generation circuits of the second clock gater circuit.

11. Circuitry as in claim 7, wherein:
a) the feedback path of the falling clock edge generation circuit of the second clock gater circuit is coupled to a first input of a logic gate, which logic gate forms a part of the feed-forward path of the falling clock edge generation circuit; and
b) the even number more inverters is coupled between the first clock input and logic gate of the second clock gater circuit.

12. Circuitry as in claim 11, wherein an input to the even number more inverters is directly coupled to the first clock input.

13. Circuitry as in claim 7, wherein the even number more inverters lies in the feed-forward path of the falling clock edge generation circuit of the second clock gater circuit.

14. Circuitry as in claim 13, wherein the feed-forward path of the rising clock edge generation circuit of the second clock gater circuit comprises a rising edge adjustment inverter, which rising edge adjustment inverter can be adjusted to change the timing of the rising edges of the second gated clock signal.

15. Circuitry as in claim 14, wherein the feed-forward path of the falling clock edge generation circuit of the second clock gater circuit comprises a load-matching inverter, which load-matching inverter can be adjusted to match loads between the falling and rising clock edge generation circuits of the second clock gater circuit.

16. Circuitry as in claim 7, wherein:
a) the feedback path of the rising clock edge generation circuit is coupled to a first input of a logic gate, which logic gate forms a part of the feed-forward path of the rising clock edge generation circuit; and
b) the even number more inverters is coupled between the second clock input and logic gate of the second clock gater circuit.

17. Circuitry as in claim 16, wherein an input to the even number more inverters is directly coupled to the second clock input.

\* \* \* \* \*